United States Patent [19]

Ipposhi et al.

[11] Patent Number: 5,061,655
[45] Date of Patent: Oct. 29, 1991

[54] METHOD OF PRODUCING SOI STRUCTURES

[75] Inventors: Takashi Ipposhi; Kozuyuki Sugahara, both of Hyogo, Japan

[73] Assignee: Mitsubishi Denki Kabushiki Kaisha, Tokyo, Japan

[21] Appl. No.: 653,086

[22] Filed: Feb. 11, 1991

[30] Foreign Application Priority Data

Feb. 16, 1990 [JP] Japan .................................. 2-36929

[51] Int. Cl.[5] .................... H01L 21/20; H01L 21/268
[52] U.S. Cl. ...................................... 437/89; 437/109; 437/173; 437/174; 437/973; 148/DIG. 154; 148/DIG. 93; 156/603
[58] Field of Search .................. 437/89, 109, 173, 174, 437/973; 148/DIG. 48, DIG. 154, DIG. 150, DIG. 93; 156/603

[56] References Cited

U.S. PATENT DOCUMENTS

| | | |
|---|---|---|
| 4,390,392 | 6/1983 | Robinson et al. ................... 437/174 |
| 4,523,962 | 6/1985 | Nishimura . |
| 4,578,142 | 3/1986 | Carboy, Jr. et al. ................. 437/89 |
| 4,714,684 | 12/1987 | Sugahar et al. . |
| 4,855,014 | 8/1989 | Kakimoto et al. . |
| 4,933,298 | 6/1990 | Hasegawa ............................ 437/89 |

FOREIGN PATENT DOCUMENTS

| | | |
|---|---|---|
| 210622 | 12/1982 | Japan ................................ 437/174 |
| 50468 | 2/1989 | Japan . |
| 36069 | 2/1990 | Japan . |

Primary Examiner—Brian E. Hearn
Assistant Examiner—Linda J. Fleck
Attorney, Agent, or Firm—Lowe, Price, LeBlanc and Becker

[57] ABSTRACT

A method of producing so-called SOI structures according to this invention includes the step of forming an opening for seeding after an insulating layer of predetermined thickness has been formed on a first monocrystal silicon layer. Further, a non-monocrystal layer, e.g., a polycrystal silicon layer is formed on the surface of the insulating layer. The surface of the polycrystal silicon layer is smoothed as by grinding. A reflection-preventive film is formed on the smoothed surface of the polycrystal silicon layer. The reflection-preventive film has a thin film region whose reflectance is substantially zero and a thick film region having a predetermined reflectance. During laser annealing, the reflection-preventive film produces a predetermined temperature distribution in the polycrystal silicon layer. The polycrystal silicon layer which has melted according to this temperature distribution recrystallizes from adjacent the seed portion and thereby forms a new monocrystal silicon layer over the entire surface. The smoothing process for the polycrystal silicon layer prevents any change in the reflectance of the reflection-preventive film and improves control on the temperature distribution in the polycrystal silicon layer.

10 Claims, 7 Drawing Sheets

METHOD OF PRODUCING SOI STRUCTURES

BACKGROUND OF THE INVENTION

1. Field of the Invention

This invention relates to a method of producing so-called SOI (Silicon On Insulator) structures in which a monocrystal semiconductor layer is formed on a monocrystal layer surface with an insulating layer interposed therebetween.

2. Description of the Background Art

In semiconductor devices, an integrated circuit having active elements which are three-dimensionally integrated to promote the degree of integration or function is referred to as a three-dimensional integrated circuit. To realize a three-dimensional integrated circuit, the technique for forming so-called SOI structures in which a monocrystal semiconductor layer is formed on an insulating layer becomes important. Among the methods of forming SOI structures is a melt recrystallization method. This melt recrystallization method is one for forming a monocrystal layer by recrystallization a polycrystal or amorphous semiconductor layer on an insulating layer by heat treatment. High output laser or electron beams are contemplated for use as energy beams, and the method using laser is chiefly used because of its improved operability. A description will now be given of a method of forming monocrystal semiconductor layers based on the melt recrystallization method using laser irradiation.

FIG. 4 is a perspective view showing the cross-sectional construction of a semiconductor device, illustrating an example of a processing step in the melt recrystallization method using laser irradiation according to the prior art. FIGS. 5A through 5C are sectional structural views showing the main step in the melt recrystallization to be described below is one using reflection-preventive film for optionally controlling the temperature distribution in a molten semiconductor layer.

First, referring to FIGS. 4 and 5A, an insulating layer 2 in the form of a silicon oxide film is formed on the surface of a silicon monocrystal substrate 1. Openings 6 are formed in predetermined regions of the insulating layer 2. The openings 6 form seed portions. Semiconductor layer, or stated concretely, polycrystal silicon layer 3 is formed on the surface of the insulating layer 2 and in the openings 6. Further, reflection-preventive films 4 of predetermined shape are formed on the surface of the polycrystal silicon layer 3. For example, silicon nitride films (SI₃N₄) are used as the reflection-preventive films 4. The reflection-preventive films 4 are substantially equispaced from the seed portions 5 formed in the insulating layer 2 (see FIG. 4). FIG. 10 shows the relation between the thickness and reflectance of the silicon nitride film. As can be understood from FIG. 10, the values of film thickness corresponding to the peak and zero values of reflectance periodically appear. With this relation utilized, silicon nitride films having thickness corresponding to the two values of reflectance are selected to form a predetermined temperature distribution in the polycrystal silicon layer 3. In a conventional example, a combination of film thickness values of 0 and approximately 600Å (60 nm) is selected. Therefore, in FIGS. 4 and 5A, the reflection-preventive films 4 selectively formed on the surface of the polycrystal silicon film 3 have a reflectance of approximately zero with respect to laser light 7; that is, they absorb substantially all incident light. On the other hand, the regions where the thickness of the reflection-preventive film (silicon nitride film) is zero; that is, the regions where the surface of the polycrystal silicon layer 3 is exposed, have a reflectance of about 40% with respect to the laser light 7. Thereby, the laser light incident on the entire surface of the polycrystal silicon layer 3 is absorbed well below the reflection-preventive film 4 and the region in question becomes hotter. As the laser light 7, use is made of laser light having a wavelength of 488 nm and a beam diameter of about 120–180 μm. And the laser light moves at a constant speed while irradiating the surface of the substrate. The polycrystal silicon layer 3 is irradiated with the laser light 7 is heated to the molten state. The resulting temperature distribution in the polycrystal silicon layer 3 is shown in FIG. 6. FIG. 6 is a temperature distribution diagram showing the relation between positions on the surface of the polycrystal silicon layer and their internal temperatures. In the temperature distribution shown, it is seen that the temperature is lower in regions adjacent the seed portions 5.

Referring to FIG. 5B, after the laser light 7 has passed, the molten polycrystal silicon layer 3 starts to decrease in temperature, crystallizing first in the lower temperature region. As shown in the temperature distribution, the temperature is low in the vicinity of the seed portions 5; in this cooling step, recrystallization starts with the seed portions. Therefore, monocrystal regions 8a having the same crystallization as that of the monocrystal silicon substrate 1 having the seed portions 5 connected thereto spread around from the seed portions 5.

Referring to FIG. 5C, the polycrystal silicon layer having completed recrystallization changes into a homogenous monocrystal silicon layer 8. Thereafter, the reflection-preventive layers 4 are removed.

However, the monocrystal silicon layer 8 formed by the melt recrystallization method using reflection-preventive films has as undulating surface formed with coarse irregularities. FIG. 7 is a diagram showing the result of measurement of the surface irregularities of the monocrystal silicon layer 8 shown in FIG. 5C. This example of measurement shows a case where the thickness of the recrystallized semiconductor film is 550 nm. In this case, the surface irregularities are not less than about ±60 nm (0.06 μm). The reason why the surface of the recrystallized silicon layer 8 has such undulating irregularities is that the reflection-preventive films 4 locally cover the surface of the molten polycrystal silicon layer 3. That is, those regions of the surface of the polycrystal silicon layer 3 melted by laser beam irradiation which are not covered with the reflection-preventive films 4 shrink or recess under the influence of the surface tension. This surface form is accountable for formation of undulations on the surface of the recrystallized monocrystal silicon layer 8. And such surface irregularities cause various drawbacks in forming a device on the monocrystal silicon layer 8, leading to non-uniformity of the performance of the device.

As a method of decreasing such surface irregularities, it may be contemplated to form a reflection-preventive film on the entire surface of the polycrystal silicon film 3. Referring to FIG. 10, in the above conventional example, a combination of 0 and 600Å (600 nm) has been used as a combination of thicknesses of reflection-preventive films having different values of reflectance. In place of this combination, it is possible to use a combination of 1200Å (120 nm) and 600Å (60 nm). The melt recrystallization method using reflection-preventive films of such combination of thicknesses will now be described with reference to FIGS. 8A and 8B. FIG. 8A is a manufacturing sectional view corresponding to FIG. 5B. A reflection-preventive film 4 forms thick film regions having a thickness of 1200Å(nm) at positions where they cover seed portions and thin film regions 4b having a thickness of 600Å between the seed portions 5. The use of such reflection-preventive film 4 prevents the surface of the molten polycrystal silicon layer 3 from being influenced by surface tension as it is fixed to the reflection-preventive film 4. Therefore, as shown in FIG. 8B, the recrystallized monocrystal silicon layer 8 has a flat surface with limited irregularities, as compared with that shown in FIGS. 5A through 5C. FIG. 9 is a diagram showing the result of measurement of the surface roughness of the monocrystal silicon layer 8 shown in FIG. 8B. As compared with FIG. 7, it is seen that the surface irregularities have decreased to about ±25 nm.

However, in the case where such reflection-preventive film having thin and thick film regions is used, there arises a problem that it is impossible to form a completely monocrystalized silicon layer on the surface of the insulating layer 2 where monocrystalized regions are discontinuously formed during the recrystallization of the polycrystal silicon layer 3. This is due to the fact that an irregular surface corresponding to the grains has formed in advance on the surface of the polycrystal silicon layer 2 formed on the surface of the insulating layer 2. The irregularities on the surface of the polycrystal silicon layer 3 change the reflectance of the reflection-preventive film 4 on the surface thereof. FIG. 12 is a diagram showing the relation, found by experiments, between the thickness of a reflection-preventive film and reflected light intensity. In this figure, the solid line refers to a case where a silicon nitride film is formed on a silicon layer whose surface irregularities are about ±0.25 nm, and the dash-dot line refers to a case where a silicon nitride film is formed on the surface of a silicon layer whose surface irregularities are about ±30 nm. When the two cases are compared with each other, it is seen that in the case of the silicon layer having smaller surface irregularities, the peak value of reflectance periodically appear, whereas in the case of the silicon layer having greater surface irregularities, the peak value of reflection intensity which periodically appears with the changing thickness of the silicon nitride film gradually decreases. This is believed to be due to the fact that as the surface irregularities of the silicon layer increase, the diffused reflection of light in the interface between the reflection-preventive film the silicon layer increases, resulting in the light being confined in the silicon nitride film, whereby the reflectance decreases. The temperature distribution in the polycrystal silicon layer 3 melted by using such reflection-preventive film whose reflectance has changed is shown in FIG. 11. According to this figure, it is seen that the difference in temperature between the regions of the polycrystal silicon layer covered with the thick and thin film regions 4a and 4b, respectively, of the reflection-preventive film 4, is mild. That is, since the reflectance for laser light in the region underlying the thick film region 4a has decreased for the reason described above, the rate of absorption of laser light increases as compared with the conventional method shown in FIGS. 5A through 5C, so that the temperature in this region arises. An a temperature gradient is produced in the vicinity of the seed portions. Thus, in the case where recrystallization takes place as the temperature decreases after the laser light has passed, the solidifying temperature is reached first in the vicinity of the regions covered with the thick film region 4a and the recrystallization starts. However, since recrystallization takes place over a relatively wide area, it is not always possible to cause recrystallization to take place continuously, starting from the seed portions 5. Therefore, a discontinuous monocrystal silicon layer will be formed.

SUMMARY OF THE INVENTION

An object of the invention is to provide a method of forming a heterogeneous monocrystal silicon layer on an insulating layer.

Another object is to prevent a reflection-preventive film used with the melt recrystallization method from decreasing in reflectance.

This invention is a method whereby on the surface of a first monocrystal semiconductor layer, a second monocrystal semiconductor layer is formed through an insulating layer. First, an opening reaching the surface of the first monocrystal semiconductor layer is formed in the insulating layer formed on the surface of the first monocrystal semiconductor layer. Then, a semiconductor layer is formed in the opening and on the surface of the insulating layer. Further, the surface of the non-monocrystal semiconductor layer is smoothed. Further, the smoothed surface of the non-monocrystal semiconductor film is formed with a reflection-preventive film provided with a first film thickness region having a first predetermined reflectance for light and a second film thickness region having a second predetermined reflectance for light. Further, after the front surface of the reflection-preventive film has been irradiated with light to melt the non-monocrystal semiconductor layer, the latter is allowed to cool for monocrystallization to form a second monocrystal semiconductor layer.

In this invention, after the surface of the semiconductor layer formed on the insulating layer and intended to be monocrystalized has been smoothed, said surface is formed with a reflection-preventive film having said first and second film thickness regions. Thereby, decrease of the reflectance of the reflection-preventive film due to the surface irregularities of the polycrystal silicon layer can be minimized. An it becomes possible to establish a predetermined temperature distribution in the polycrystal silicon layer by using the reflection-preventive film having a predetermined reflectance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiments of the invention will now be described with reference to the drawings.

Figure 1A:
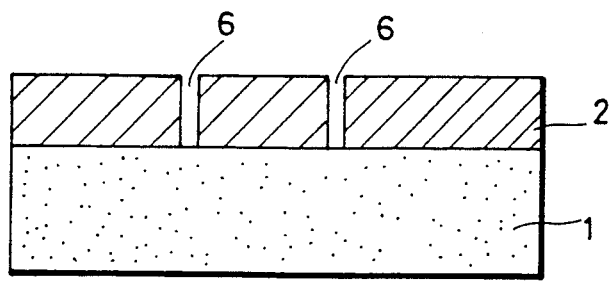
FIGS. 1A, 1B, 1C, 1D, 1E and 1F are manufacturing sectional views showing a method of producing a semiconductor device using a reflection-preventive film according to a first embodiment of the invention.

First, as shown in FIG. 1A, an insulating layer 2 in the form of a first monocrystal silicon oxide film is formed on the surface of a first monocrystal silicon layer 1 having a main surface (1 0 0) by thermal oxidation or CVD. An openings 6 are formed in the insulating layer 2 by photolithography and etching. The openings form seed portions.

Figure 1B:
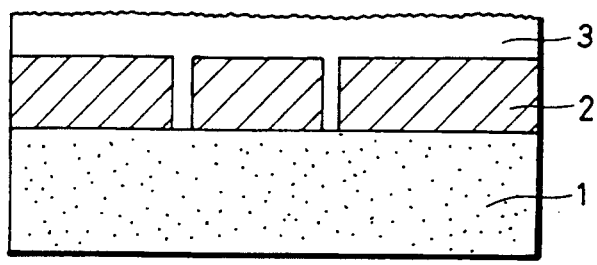

Then, as shown in FIG. 1B, a polycrystal silicon layer 3 is deposited on the surface of the insulating layer 2 by low pressure CVD method at a temperature of about 620° C. The surface of the polycrystal silicon layer 3 thus formed has irregularities of about 550Å corresponding to the grains.

Figure 1C:
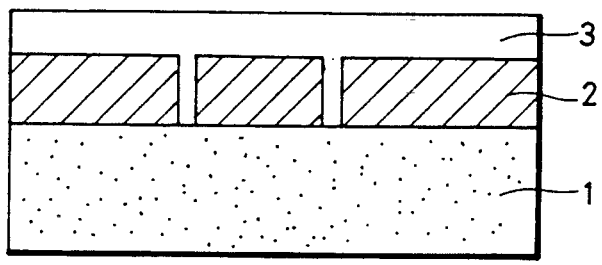

Further, as shown in FIG. 1C, the irregular surface of the polycrystal silicon layer 3 is smoothed. This processing step employs grinding or etch-back. As for grinding, so-called rigid grinding is preferable. For example, rigid grinding is disclosed in Japanese Patent Laying-Open No. H2-36069. Rigid grinding is a method for rotatively grinding the surface of the polycrystal silicon layer 3 while dripping liquid colloidal silica onto a surface plate made of such rigid material as silicon oxide ($SiO_2$). If this grinding method is used, the surface irregularities of the polycrystal silicon layer 3 can be reduced to several Å. Further, when etch-back is used, a resist or the like is applied to the surface of the polycrystal silicon layer 3 to smooth said surface. Thereafter, etching is employed to smooth the surfaces of the resist and polycrystal silicon layer 3. Thereby, the surface of the polycrystal silicon layer 3 is smoothed.

Figure 1D:
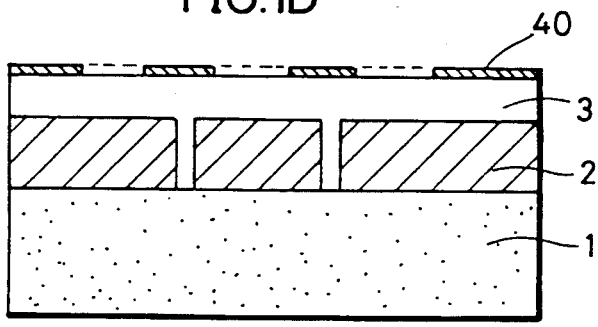

Further, as shown in FIG. 1D, a silicon nitride film 40 of about 600 Å in thickness is deposited on the smoothed surface of the polycrystal silicon layer 3 and patterned to a predetermined shape.

Figure 1E:
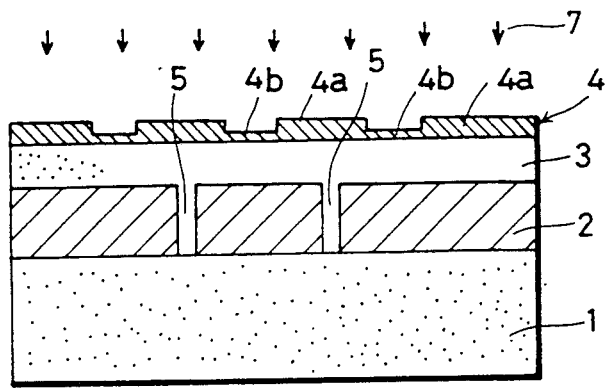

Further, as shown in FIG. 1E, a silicon nitride film of about 600 Å in thickness is deposited on the surface of the polycrystal silicon layer 3 and the surface of the silicon nitride film 40, thereby forming a reflection-preventive film 4 having a thin film region 4b with a film thickness of about 600 Å and a thick film region 4a with a film thickness of about 1200 Å. In addition, it is also possible to use another method of forming a reflection-preventive film 4, which comprises the steps of depositing a silicon nitride film of about 1200 Å in thickness, selectively reducing the film thickness by photolithography and etching, so as to form the thin film region 4b of the silicon nitride film. And a beam having a diameter of about 120-180 μm and a wavelength of 488 nm is used to irradiate the surface of said reflection-preventive film 4 from thereabove while traveling in a predetermined direction. Thereby, the polycrystal silicon layer 3 melts with a low temperature distribution immediately below the thick film region 4a and a high temperature distribution immediately below the thin film region 4a of the reflection-preventive film 4. And after the beam has passed, the recrystallization proceeds in all directions from adjacent the seed portions 5 as the temperature decreases.

Figure 1F:
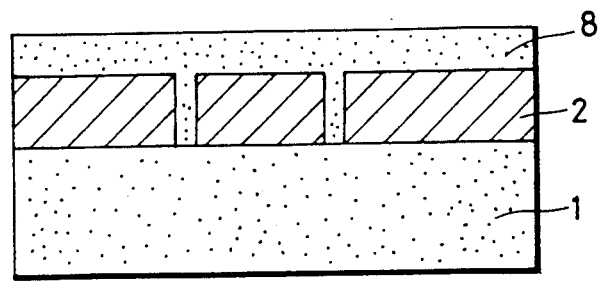

And as shown in FIG. 1F, a second monocrystal silicon layer 8 is formed on the surface of the insulating layer 2 as a result of recrystallization spreading around from the seed portions 5.

Figure 2:
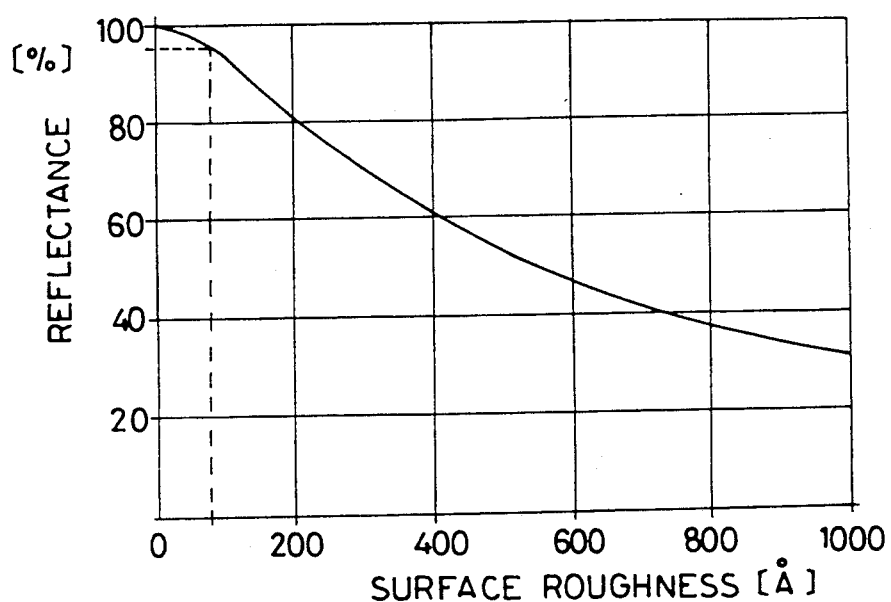
FIG. 2 is a diagram showing the relation between the surface roughness of a polycrystal silicon layer and its reflectance.

The smoothing of the surface of the polycrystal silicon layer 3 in the processing step shown in FIG. 1C will now be described. Usually, the accuracy of the thickness of a reflection-preventive film during formation is about ±10%. And it has been found that this amount of scatter in accuracy little hinders laser recrystallization. When this scatter in the thickness of the reflection-preventive film is converted to a change in reflectance, it is seen that referring to FIG. 10, this change in reflectance with respect to a film thickness error of about ±10% from the film thickness of 600 Å is about ±4%. Therefore, if the change in reflectance is within ±4%, then this is suggested to be within the margin of laser crystallization process. Therefore, if the change in reflectance due to the surface irregularities of the polycrystal silicon layer 3 is set within the reflectance change of ±4% which is the margin associated with the processing, it will be found that there is almost no problem in recrystallization process which uses a reflection-preventive film having thin and thick film regions. FIG. 2 is diagram showing the relation between the surface roughness of a polycrystal silicon layer and its reflectance. If the surface roughness is derived from the relation of FIG. 2 with attention paid to the allowable range of change in reflectance being 4±%, it is seen that the surface irregularities of a polycrystal silicon layer 3 corresponding to a reflectance of 100%–4% correspond to 7.5 nm (75 Å). Therefore, laser recrystallization process can be accurately performed by smoothing the polycrystal silicon layer 3 in the above example to ±7.5 nm or less. Therefore, if the wavelength of the light used for recrystallization is changed, these data change. However, by the same method and depending on the wavelength of light to be used, it is possible to set optimum values for the surface roughness of the polycrystal silicon layer 3 and the thickness of the reflection-preventive film 5.

Figure 3A:
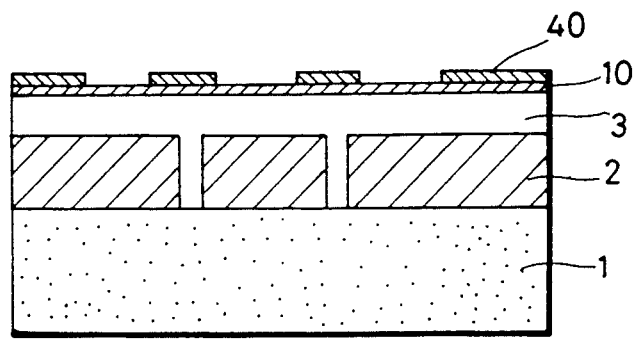
FIGS. 3A, 3B and 3C are manufacturing sectional views of a semiconductor device according to a second embodiment of the invention.
Figure 3B:
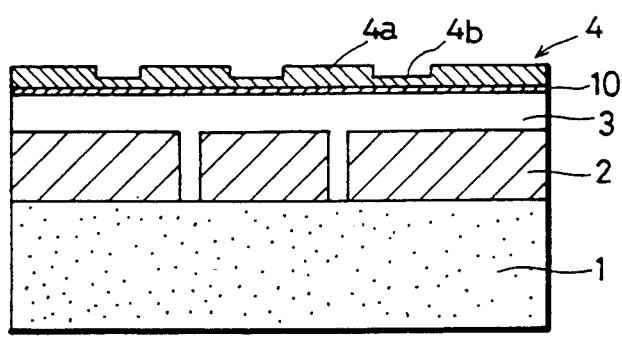
Figure 3C:
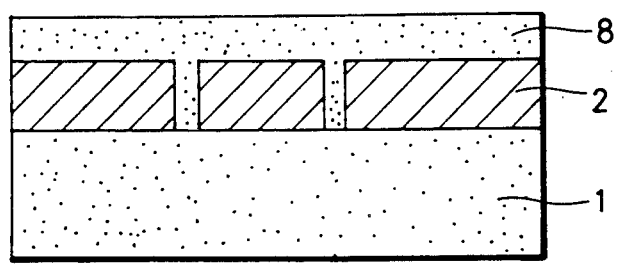
Figure 4:
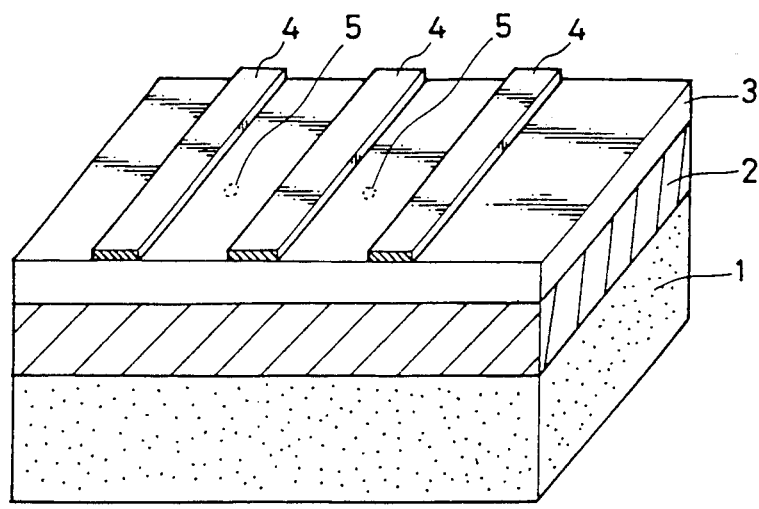
FIG. 4 is a perspective view, in section showing a typical processing step in the melt recrystallization method for a semiconductor device using a conventional reflection-preventive film.
Figure 5A:
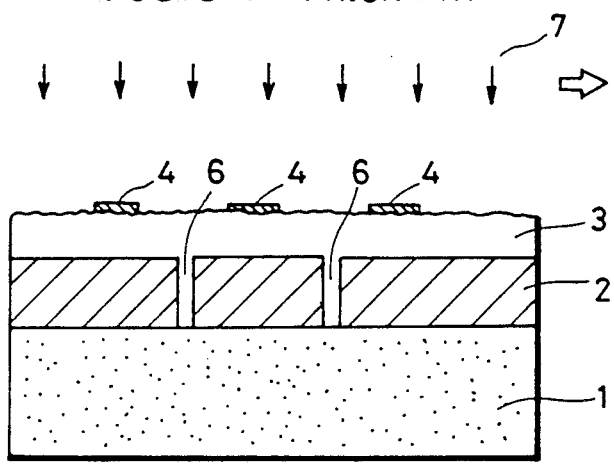
FIGS. 5A, 5B and 5C are manufacturing sectional views showing the conventional melt recrystallization method in FIG. 4.
Figure 5B:
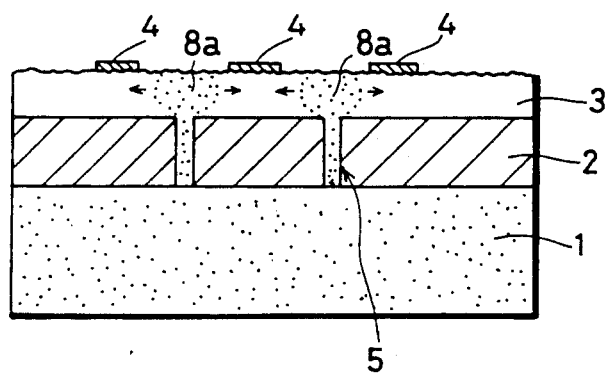
Figure 5C:
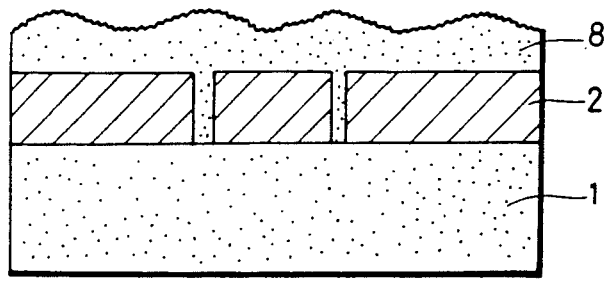
Figure 6:
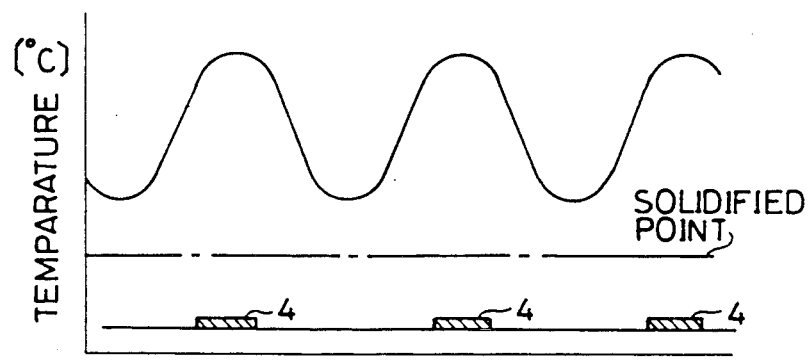
FIG. 6 is a diagram showing a temperature distribution in a molten polycrystal silicon layer.
Figure 7:
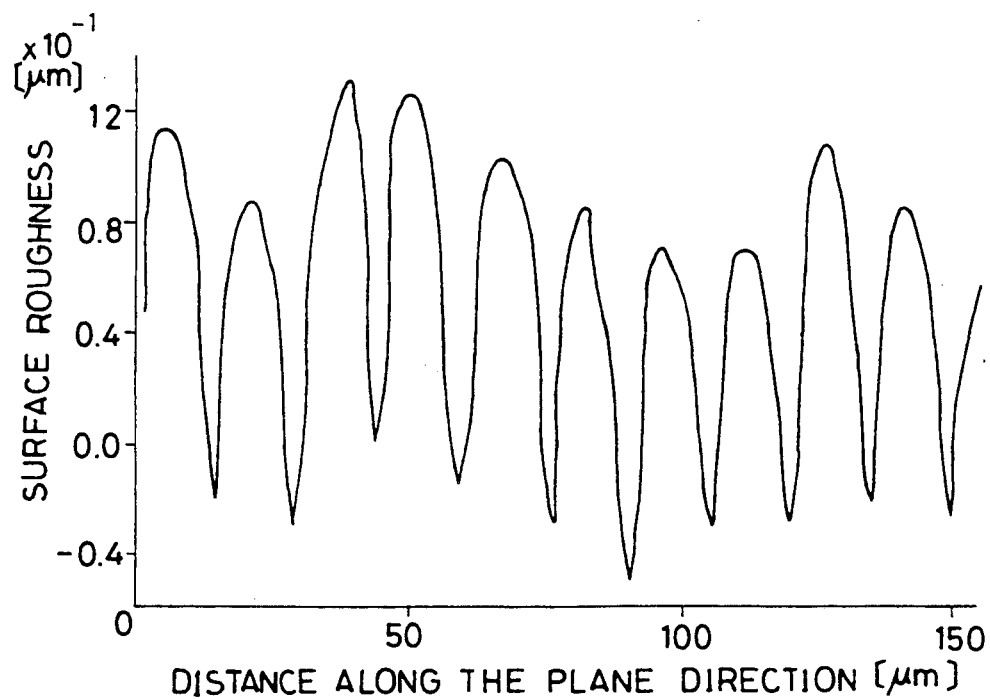
FIG. 7 is a diagram showing the result of measurement of the surface roughness of a polycrystal roughness of a polycrystal silicon layer formed through the processing step shown in FIGS. 5A through 5C.
Figure 8A:
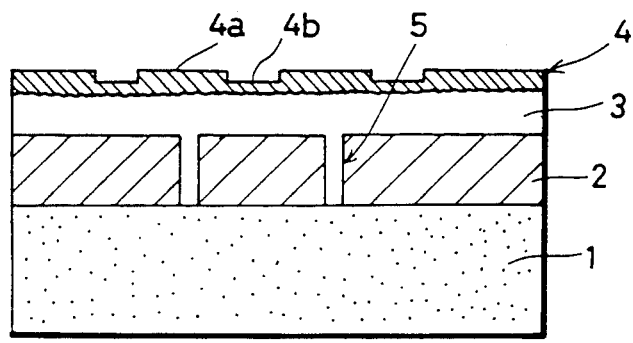
FIGS. 8A and 8B are manufacturing sectional views showing another melt recrystallization method using a conventional reflection-preventive film.
Figure 8B:
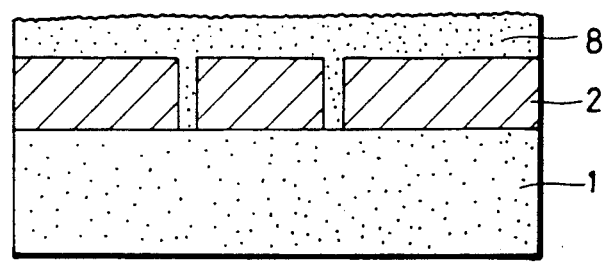
Figure 9:
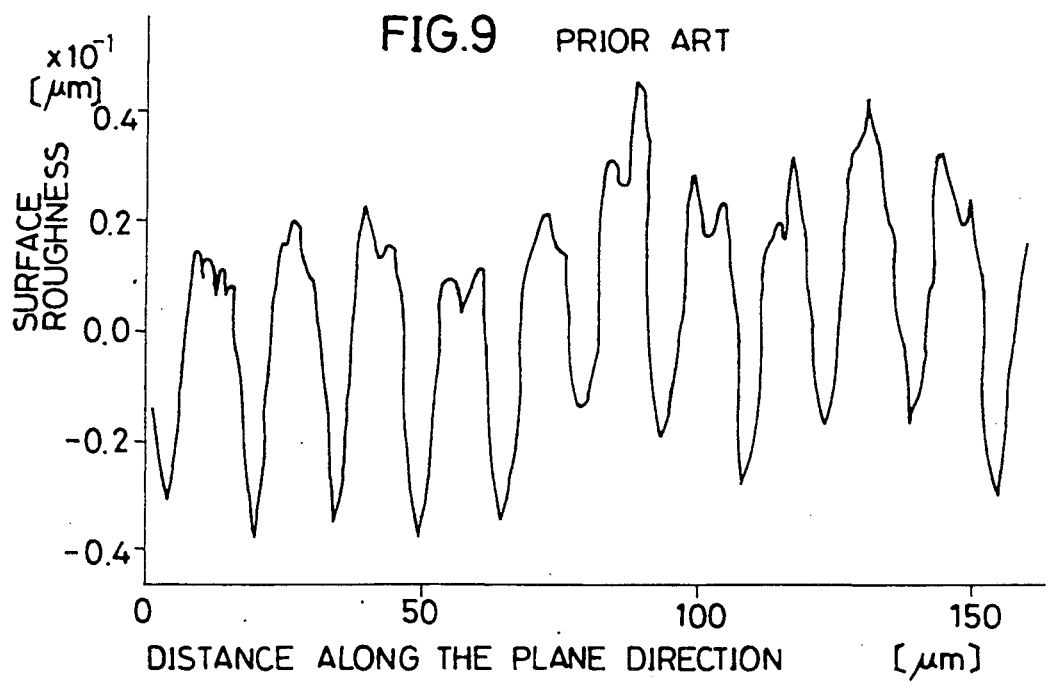
FIG. 9 is a diagram showing the result of measurement of the surface roughness of a monocrystal silicon layer formed by the producing method shown in FIGS. 8A and 8B.

A second embodiment of the invention will now be described. The second embodiment is characterized in that after the formation of a silicon oxide film 10 of about 100 Å in thickness on the smoothed surface of the polycrystal silicon layer 3, a reflection-preventive film 4 is formed on the surface of said silicon oxide film 10. The processing step shown in FIG. 3A corresponds to the processing step shown in FIG. 1D except for the formation of the silicon oxide film 10. Similarly, FIG. 3B corresponds to FIG. 1E and FIG. 3C corresponds to FIG. 1F. The silicon oxide film 10 interposed between the reflection-preventive film 4 and the polycrystal silicon layer 3 functions to prevent the silicon nitride film and the reflection-preventive film from reacting with the polycrystal silicon layer 3 to form a silicon nitride on the interface therebetween or to form voids owing to gases contained in the silicon nitride film.

Figure 10:
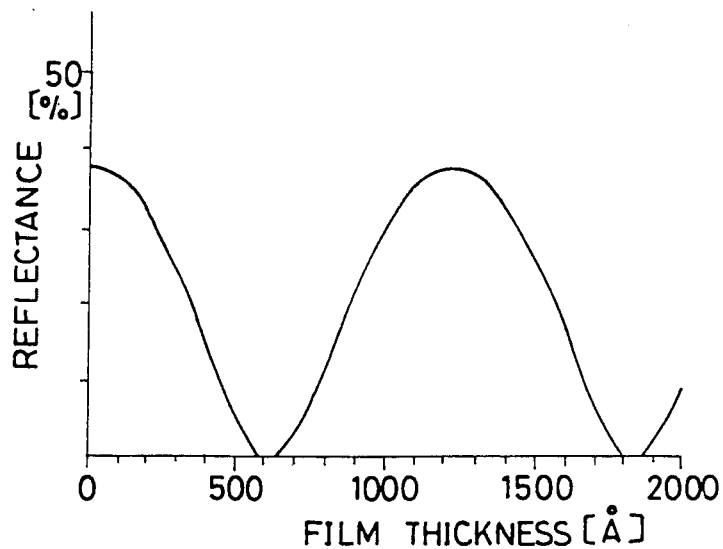
FIG. 10 is a diagram showing the relation between the film thickness of a silicon nitride film and its reflectance.
Figure 11:
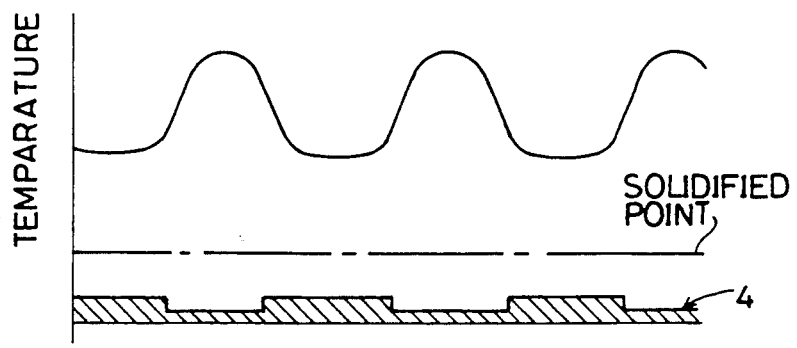
FIG. 11 is a diagram showing a temperature distribution in the molten polycrystal silicon layer in FIG. 8A.
Figure 12:
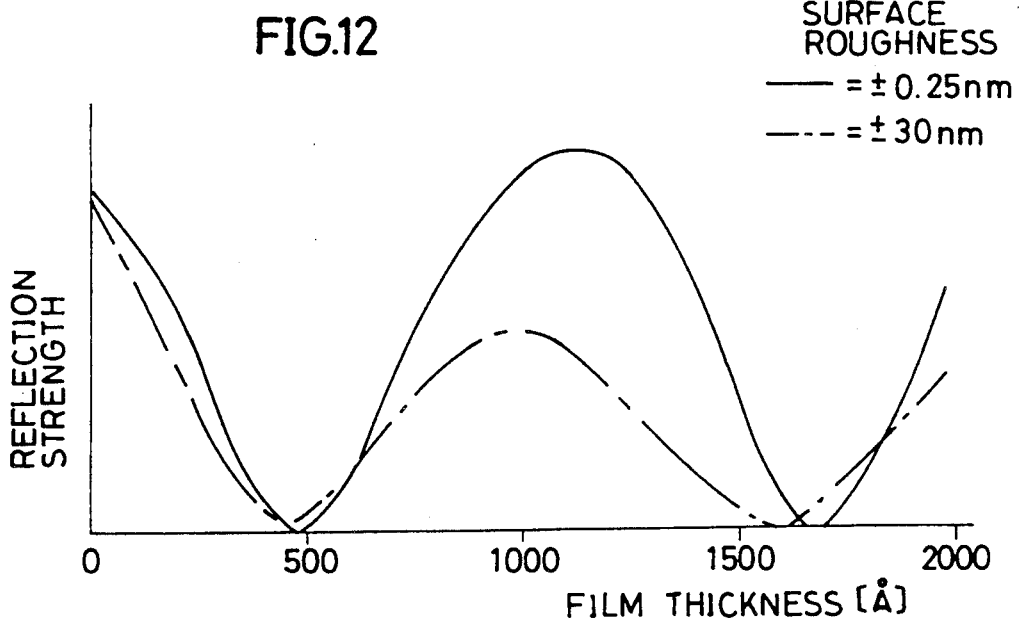
FIG. 12 is a diagram showing the relation between the thickness of a reflection-preventive film formed on a polycrystal silicon layer having a different surface roughness, and reflection intensity.

In addition, the above embodiments have been described with reference to the use of a combination of a film thickness of 600 Å and a film thickness of 1200 Å shown in FIG. 10 as a combination of the first and second film thickness regions of the reflection-preventive film. However, the invention is not limited thereto, and similar effects can also be obtained even if different combinations of film thickness values having different reflectance values are used.

Further, the non-monocrystal semiconductor layer is not limited to a polycrystal silicon layer but may be an amorphous layer.

Further, by smoothing the surface of the polycrystal silicon layer 3 before recrystallization, diffused reflection on said surface is reduced; therefore, there is another merit that processes such as patterning for silicon nitride films can be stabilized.

In the method of producing SOI structures according to the invention, the irregular surface of a non-monocrystal layer formed on an insulating layer is smoothed, a reflection-preventive film is formed and then laser annealing is applied; therefore, optimum temperature control can be made without causing a change in the predetermined reflectance, so that it becomes possible to form a continuous heterogeneous monocrystal silicon layer on the insulating layer by recrystallization.

Further, the above embodiments have been described with reference to the melt recrystallization method using the seed portions formed in the insulating layer. However, the invention is also applicable to the melt recrystallization method without using any seed portions.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of producing a SOI structure with a first monocrystal semiconductor layer formed with a second monocrystal semiconductor layer with an insulating layer interposed therebetween, comprising the steps of:
    forming an opening in said insulating layer formed on a surface of said first monocrystal semiconductor layer, said opening reaching the surface of said first monocrystal semiconductor layer,
    forming a non-monocrystal semiconductor layer in said opening and on a surface of said insulating layer,
    smoothing the surface of said non-monocrystal semiconductor layer,
    forming a reflection-preventive film on the smoothed surface of said non-monocrystal semiconductor layer, said reflection-preventive film having alternating first and second film thickness regions having first and second reflectances for light,
    melting said non-monocrystal semiconductor layer by irradiating the surface of said reflection-preventive film with light and then cooling it for monocrystallization to form a second monocrystal semiconductor layer.

2. A method of producing a SOI structure according to claim 1, wherein said reflection-preventive film has a thickness such that either the first or the second film thickness region thereof has substantially zero reflectance.

3. A method of producing a SOI structure according to claim 1, wherein step of smoothing the surface of said polycrystal silicon layer is performed by rubbing the surface of said polycrystal silicon layer against the surface of a surface plate made of rigid material.

4. A method of producing a SOI structure according to claim 1, wherein after the step of smoothing the surface of said polycrystal silicon layer, an oxide film is formed on the surface of the said polycrystal silicon layer.

5. A method of processing a SOI structure, including an insulating layer formed on a monocrystal semiconductor layer, to produce a silicon on insulator semiconductor device, comprising the steps of:
    forming openings in said insulating layer at regular intervals, said openings extending from a top surface of said insulating layer through said insulating layer to the underlying monocrystal semiconductor layer;
    forming a non-monocrystal semiconductor layer on said insulating layer and in said openings;
    smoothing a surface of said non-monocrystal semiconductor layer;
    forming a light reflection-preventive film of successively alternating first and second thickness regions along the smoothed surface of the non-monocrystal semiconductor layer, said first thickness regions having a higher light reflection capability than said second thickness regions and positioned above said openings;
    irradiating the surface of said reflection-preventive film to melt said non-monocrystal semiconductor layer; and
    cooling the melted layer;
    whereby a second monocrystal semiconductor layer is formed.

6. A method of processing a SOI structure as recited in claim 5, further comprising the step of removing said reflection-preventive film subsequent to said step of cooling.

7. A method of producing a SOI structure with a first monocrystal semiconductor layer formed with a second monocrystal semiconductor layer with an insulating layer interposed therebetween, comprising the steps of:
    forming an insulating layer formed on a surface of said first monocrystal semiconductor layer,
    forming a non-monocrystal semiconductor layer on a surface of said insulating layer,
    smoothing the surface of said non-monocrystal semiconductor layer, forming a reflection-preventive film on the smoothed surface of said non-monocrystal semiconductor layer, said reflection-preventive film having alternating first and second film thickness regions having first and second reflectances for light, melting said non-monocrystal semiconductor layer by irradiating the surface of said reflection-preventive film with light and then cooling it for monocrystallization to form a second monocrystal semiconductor layer.

8. A method of producing a SOI structure according to claim 7, wherein said reflection-preventive film has a thickness such that either the first or the second film thickness region thereof has substantially zero reflectance.

9. A method of producing a SOI structure according to claim 7, wherein step of smoothing the surface of said polycrystal silicon layer is performed by rubbing the surface of said polycrystal silicon layer against the surface of a surface plate made of rigid material.

10. A method of producing a SOI structure according to claim 7, wherein after the step of smoothing the surface of said polycrystal silicon layer, an oxide film is formed on the surface of the said polycrystal silicon layer.

* * * * *